United States Patent
Nakanishi et al.

[11] Patent Number: 5,966,325
[45] Date of Patent: Oct. 12, 1999

[54] SEMICONDUCTOR MEMORY DEVICE WITH IMPROVED READ SPEED

[75] Inventors: Hiroaki Nakanishi; Satoru Taji, both of Hyogo, Japan

[73] Assignee: Ricoh Company, Ltd., Tokyo, Japan

[21] Appl. No.: 09/031,001

[22] Filed: Feb. 26, 1998

[30] Foreign Application Priority Data

Feb. 28, 1997 [JP] Japan .................................. 9-062310

[51] Int. Cl.⁶ .................................................. G11C 13/00
[52] U.S. Cl. .................................... 365/185.01; 365/185.1
[58] Field of Search ............................ 365/200, 230.01, 365/185.01, 185.1, 185.14

[56] References Cited

U.S. PATENT DOCUMENTS 5,029,130   7/1991   Yeh .
5,280,446   1/1994   Ma et al. .
5,687,125  11/1997   Kikuchi ................................. 365/200

Primary Examiner—Terrell W. Fears
Attorney, Agent, or Firm—Cooper & Dunham LLP

[57] ABSTRACT

A memory cell of a memory device is constructed such that a source diffusion layer is divided into blocks each containing 16 word lines, and such that a drain diffusion layer is not divided. Each segment of the source diffusion layer is connected to a metal bit line via a block selection MOS transistor. The metal bit line is formed on an insulating film provided on the source diffusion layer so as to be parallel with the source diffusion layer. The block selection MOS transistor is connected to the metal bit line via a contact hole. A gate electrode of the block selection MOS transistor is formed of a polysilicon film for providing a selection gate used to form a word line of the memory cell. A source diffusion layer and a drain diffusion layer of the block selection MOS transistor are formed of the same material as the source diffusion layer of the memory cell and the drain diffusion layer of the memory cell.

11 Claims, 6 Drawing Sheets

SEMICONDUCTOR MEMORY DEVICE WITH IMPROVED READ SPEED

BACKGROUND OF THE INVENTION

1. Field of the Invention

The present invention generally relates to non-volatile semiconductor memory devices such as an ERPOM, an EEPROM or a flash memory having a floating gate and, more particularly, to a non-volatile semiconductor memory device with an offset provided between the floating gate and the source region.

2. Description of the Related Art

When an electrically alterable EEPROM or a flash memory is over-erased, the channel underneath the floating gate is placed in a depletion state and conducts a leakage current during a read operation of the other memory cells connected to the same bit line. For this reason, an ETOX (E-prom with Tunnel Oxide) memory cell such as an ordinary EPROM is controlled to ensure that over-erase does not occur by performing chip-by-chip verification or bit-by-bit verification. However, such control is difficult to achieve. Other disadvantages are that a verification circuit should be added to the memory cell and that an erase operation takes a relatively long time. An ETOX flash memory cell has a stacked-gate construction such that the floating gate and the control gate are provided as self-aligned patterns, the gate insulating film serving as a tunnel film on the order of 100Å.

In one approach to overcome the aforementioned disadvantage, a floating gate is formed on an tunnel insulating film formed on a channel region between a drain diffusion layer and a source diffusion layer formed on a substrate such that the floating gate is displaced toward a first one of the drain diffusion layer and the source diffusion layer, producing an offset between the floating gate and a second one of the drain diffusion layer and the source diffusion layer. A control gate (or a selection gate) is formed to cover the floating gate via an insulating film. The control gate extends over the floating gate so as to cover a portion of the channel beneath the offset. Such a memory cell comprises a memory channel underneath the floating gate and a selection channel between the edge of the floating gate and the second one of the diffusion layers.

Due to the presence of the selection channel, the device according to the aforementioned approach will not conduct a leak current even if the memory channel is placed in a depletion state.

For example, U.S. Pat. Nos. 5,029,130 and 5,280,446 disclose such a device.

FIG. 1 shows a memory matrix comprising memory cells each having a three-layer polysilicon construction. A common source diffusion layer 4 and a common drain diffusion layer 2 are formed on a silicon substrate so as to be parallel with each other. A floating gate 6 is formed to cover the substrate via a tunnel oxidizing film. The floating gate 6 overlaps a portion of the drain diffusion layer 2 and is offset by a certain distance from the source diffusion layer 4. A control gate 8 is formed to cover the floating gate 6 via an insulating film so as to be parallel with the source diffusion layer 4 and the drain diffusion layer 2. An element separation region 16 separates the channels of the memory cells adjacent to each other in a direction in which the control gate 8 extends.

A band-like selection gate 10 is formed to cover the control gate 8 and the substrate via an insulating film in a direction perpendicular to a direction in which the diffusion layers 2 and 4 extend. A selection channel is formed in a substrate region underneath the selection gate 10 between the edge of the floating gate 6 and the source diffusion layer 4.

In a memory cell having a two-layer polysilicon construction, the control gate also serves as the selection gate. That is, the selection gate 10 of FIG. 1 also serves as the control gate.

FIG. 2 is an equivalent circuit of the memory matrix of FIG. 1. The drain diffusion layer 2 and the source diffusion layer 4 extend so as to be common to a plurality of memory cells. In the illustrated example, the diffusion layer 2 is also common to the memory cells laterally adjacent thereto on respective sides, and the diffusion layer 4 is also common to the memory cells laterally adjacent thereto on respective sides. That is, the diffusion layers 2 and 4 extend so as to be common to a total of 2048 memory cells. The drain diffusion layer 2 is connected to a metal virtual ground (VG) line 12 via a contact hole. The source diffusion layer 4 is connected to a metal bit line 14 via a contact hole. The control gate 8 is formed to be parallel with the direction in which the diffusion layers 2 and 4 extend so as to be common to a plurality of memory cells. The selection gate 10 extends in the direction perpendicular to the direction in which the diffusion layers 2 and 4 extend so as to be common to a plurality of memory cells and to form a word line (WL).

In the memory cell of FIG. 2, the selection gate 10 is disposed so as to cross the control gate 8 so that the drain diffusion layer 2 and the source diffusion layer 4 are common to a relatively large number of memory cells and the number of contacts between the memory diffusion layers 2, 4 and the metal lines 12, 14, respectively, is reduced. Thus, the degree of integration is improved.

In the example of FIGS. 1 and 2, the source diffusion layer 4 is common to the memory cells laterally adjacent thereto on respective sides. Longitudinally, the source diffusion layer 4 is common to a series of 1024 memory cells on one side. The result is that a total of 2048 memory cells are connected to the source diffusion layer 4. That is, 2048 memory cells are connected to one metal bit line 14 to which a sense amplifier for reading data from a memory cell is coupled.

When a large number of memory cells are connected to the bit line, the diffusion capacitance imposed on the bit line is relatively high. Thus, it is difficult to improve the speed of a read operation.

The aforementioned problem is not limited to a memory device provided with memory cells of a three-layer polysilicon construction as shown in FIGS. 1 and 2. The same problem may also occur in a memory device provided with memory cells with a two-layer polysilicon construction.

SUMMARY OF THE INVENTION

Accordingly, an object of the present invention is to provide a semiconductor memory device in which the aforementioned problem is eliminated.

Another and more specific object of the present invention is to increase a read speed in a semiconductor memory device comprising memory cells each having a two-layer polysilicon construction or a three-layer polysilicon construction.

The memory matrix according to the present invention is divided into blocks each including a plurality of memory cells. The memory diffusion layer connected to a sense amplifier in a read operation is divided into independent segments corresponding to the respective blocks. A plurality of blocks are connected to a common metal bit line via block selection transistors. The block selection transistors are MOS transistors each provided with a drain region and a source region which are each formed of the same material as one of the diffusion layers that constitute the memory cell (memory diffusion layers). Each of the block selection transistors is also provided with a gate electrode formed of the same conductive material as the selection gate of the memory cell. With this construction, the memory diffusion layer can be selectively connected to the metal bit line so that the diffusion capacitance imposed on the metal bit line is reduced and the read speed is improved.

When the block selection transistor is provided between the metal line and the memory diffusion layer, a voltage drop commensurate with the threshold voltage of the block selection transistor occurs between the metal line and the memory diffusion layer. Accordingly, in order to prevent the quality of a write operation and a read operation from being degraded, it is advantageous that the memory diffusion layer that is not connected to the sense amplifier in a read operation be formed so as to be common to a plurality of blocks and not connected to block selection transistors.

The block selection transistors may be formed as MOS transistors such that the source diffusion layer and the drain diffusion layer thereof is not contiguous with each other in a direction in which the associated memory diffusion layer extends. A gap between the source diffusion layer of the block selection MOS transistor and the drain diffusion layer of the block selection MOS transistor may be equal to a channel length of the block selection MOS transistor. The gate electrode formed of the same conductive material as the selection gate may be provided above the gap. Such a block selection MOS transistor can be produced at the same time as the memory cells are produced. Accordingly, the number of processes is not increased.

By ensuring that the channel width of the block selection transistors is greater than the width of the memory diffusion layer of the memory cell, an on-current for the block transistors is increased, enabling a high-speed read operation.

The gate electrode formed above the gap between the diffusion layers of the block selection transistor may be wider than the gap between the diffusion layers. The gate electrode may also overlap portions of the diffusion layers opposite to each other across the gap. In this way, the block selection transistors can be formed properly even when misalignment occurs in producing the memory cells.

One of the diffusion layers of each of the block selection transistors may be connected to the metal bit line via a contact hole, and the other of the diffusion layers may be contiguous with the memory diffusion layer segmented corresponding to respective blocks. In this way, one of the diffusion layers of the block selection transistor can be directly connected to one of the memory diffusion layers so that the degree of integration is increased.

BRIEF DESCRIPTION OF THE DRAWINGS

Other objects and further features of the present invention will be apparent from the following detailed description when read in conjunction with the accompanying drawings.

DETAILED DESCRIPTION OF THE PREFERRED EMBODIMENTS

Figure 1:
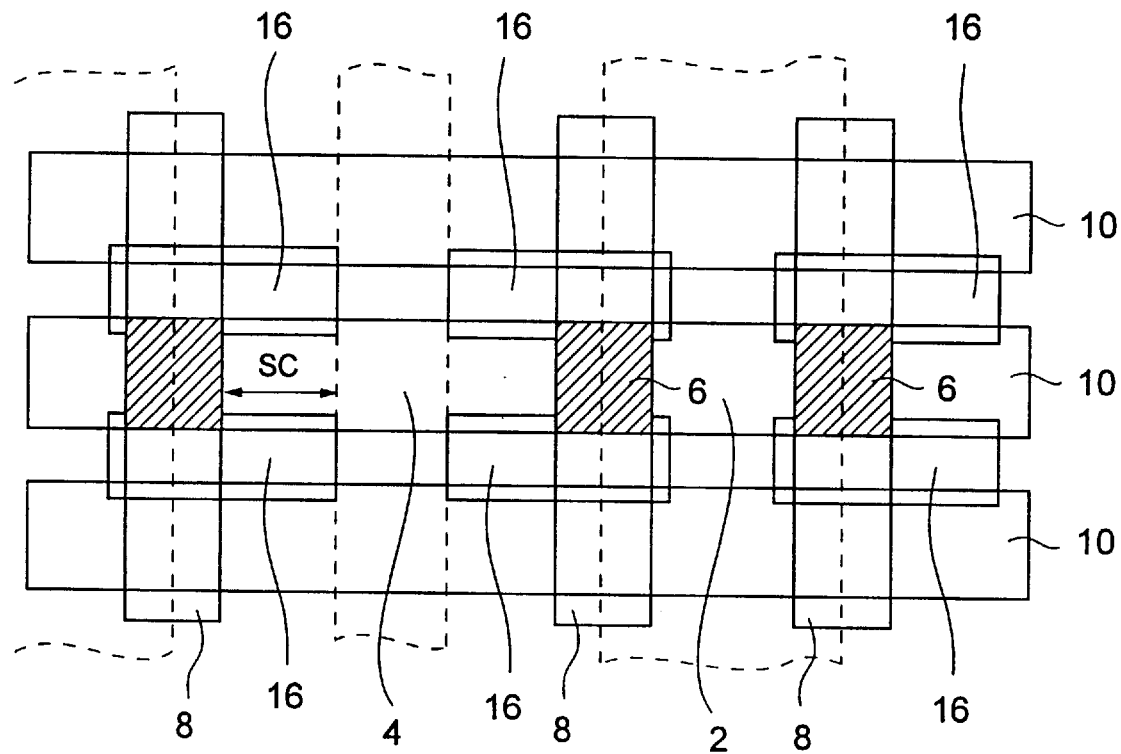
FIG. 1 shows a memory matrix comprising memory cells each having a three-layer polysilicon construction.
Figure 2:
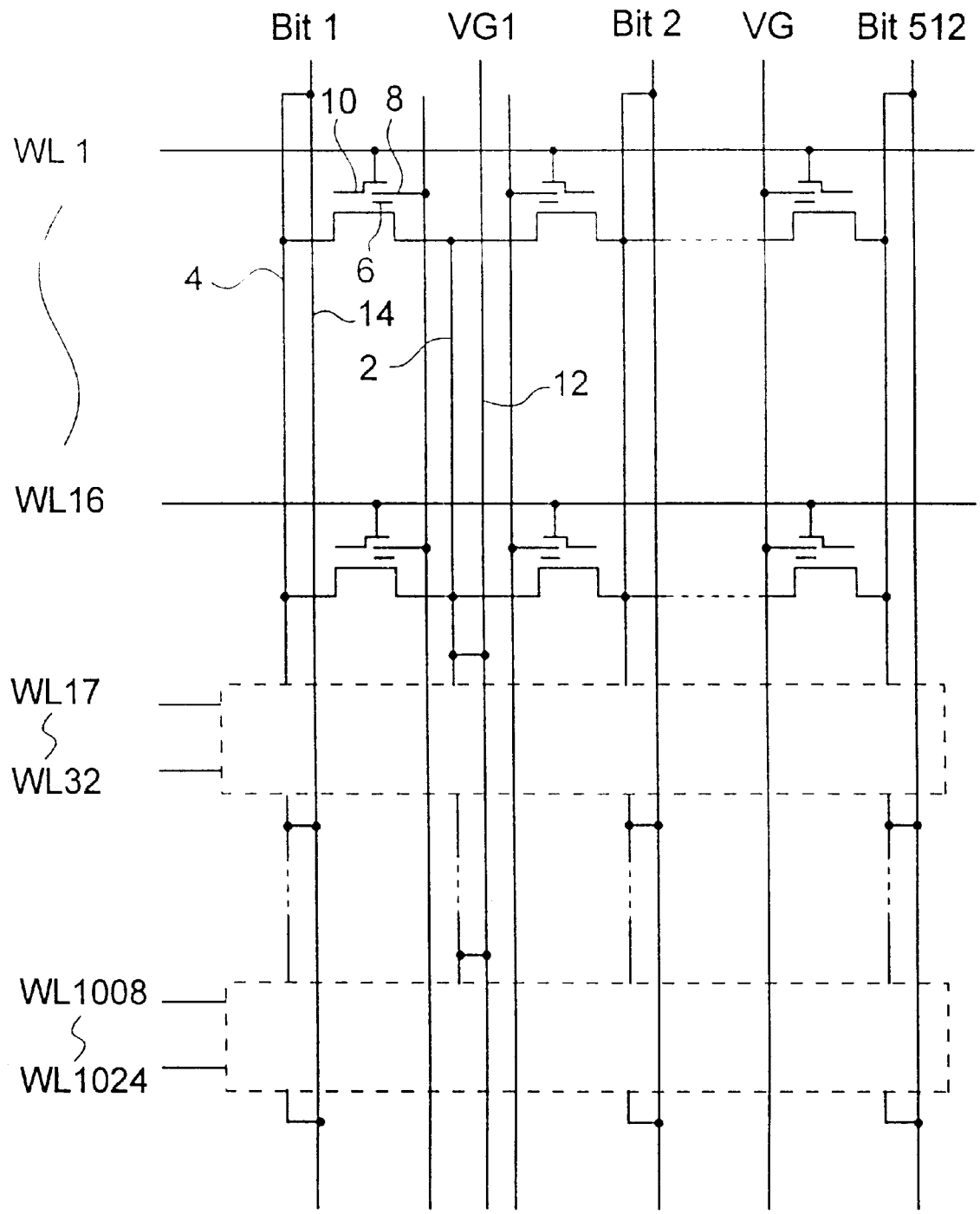
FIG. 2 is an equivalent circuit of the memory matrix of FIG. 1.
Figure 3:
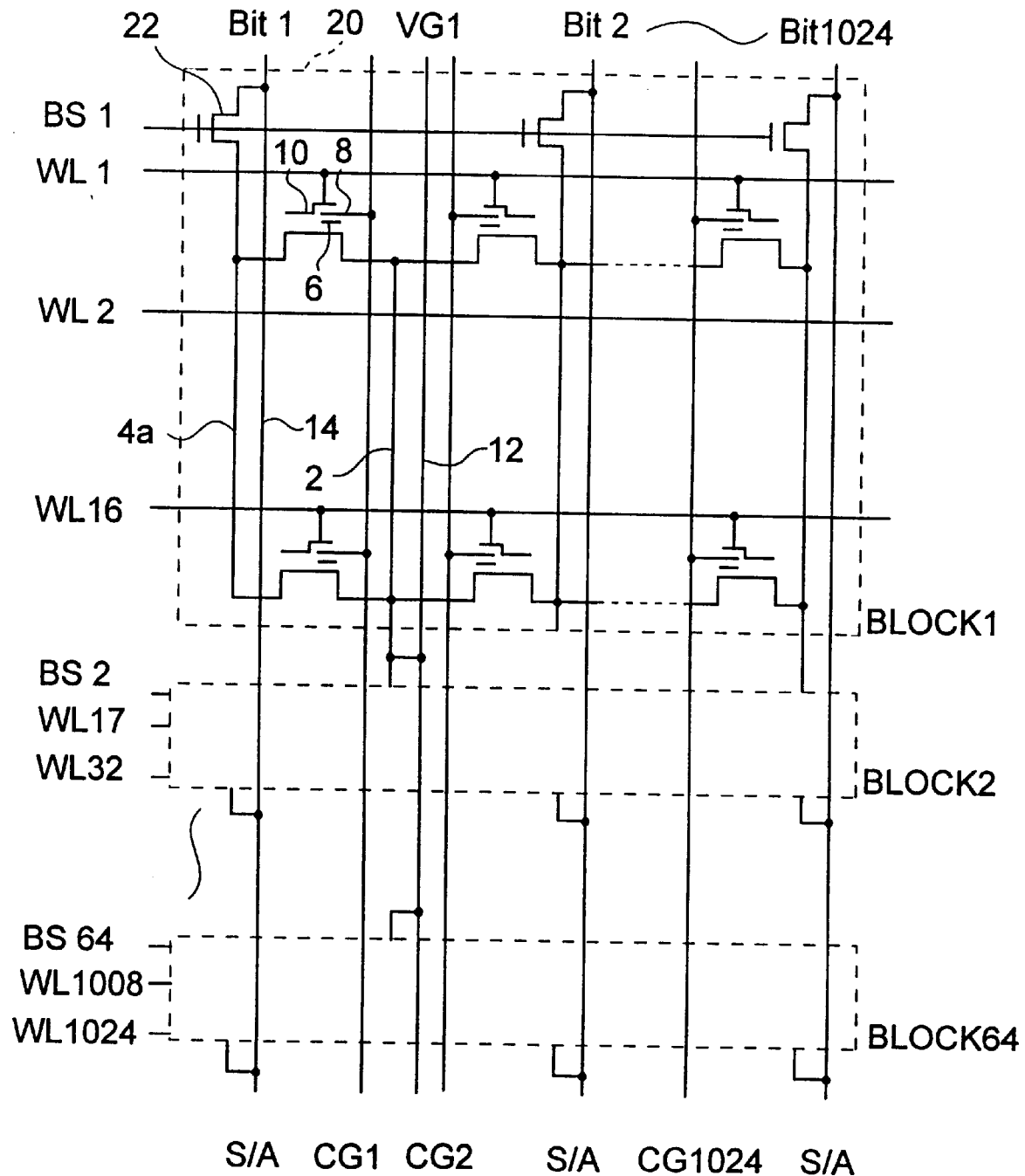
FIG. 3 shows a memory device according to an embodiment of the present invention.
Figure 4A:
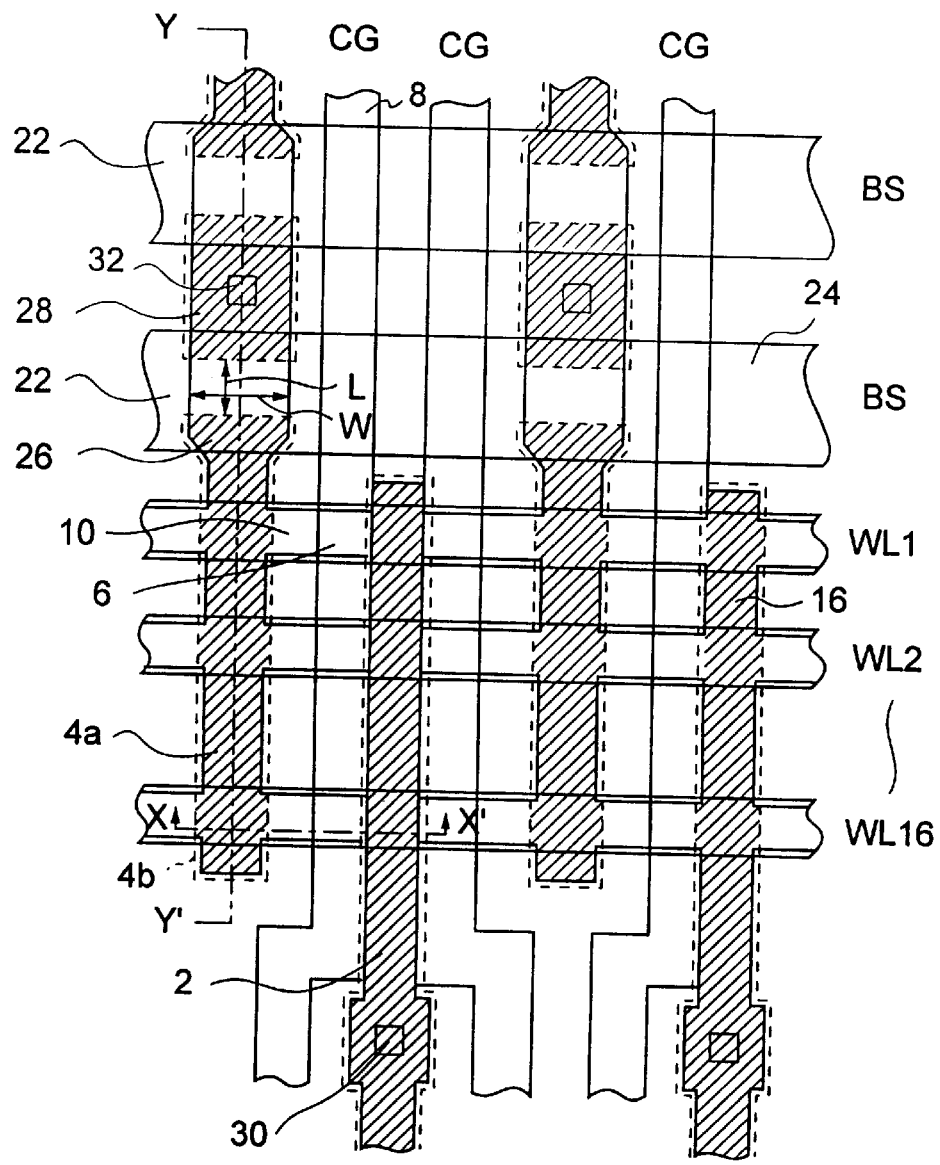
FIG. 4A is a top view showing a construction of a portion of a memory cell array corresponding to one block.
Figure 4B:
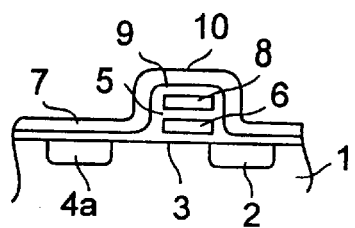
FIG. 4B is a sectional view taken along the line X-X' of FIG. 4A.
Figure 4C:
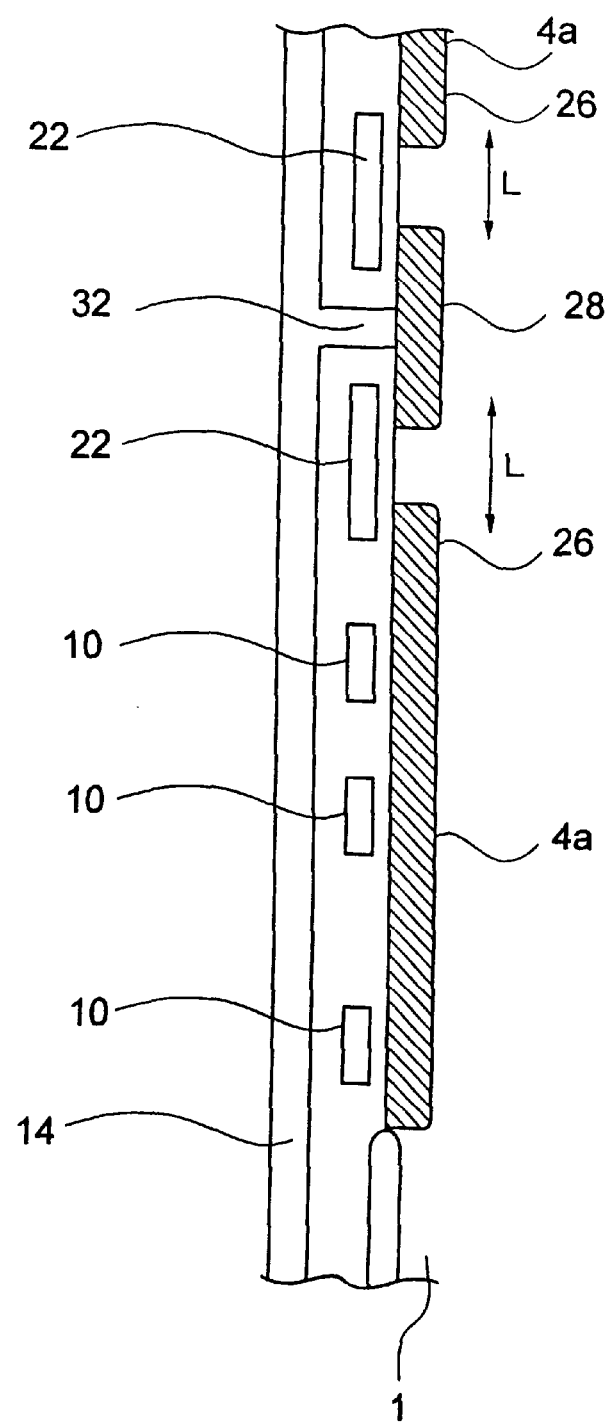
FIG. 4C is a sectional view taken along the line Y-Y' of FIG. 4A.

FIG. 3 shows a memory device according to an embodiment of the present invention provided with memory cells of a three-layer polysilicon construction. FIG. 4A is a top view showing a construction of a portion of a memory cell array corresponding to one block. FIG. 4B is a sectional view taken along the line X-X' of FIG. 4A, showing one memory cell. FIG. 4C is a sectional view taken along the line Y-Y' of FIG. 4A. In FIGS. 4A, 4B and 4C, those parts that are identical to the corresponding parts of FIGS. 1 and 2 are designated by the same references numerals.

The drain diffusion layer 2 and a source diffusion layer 4a are formed on a silicon substrate so as to be parallel with each other. The diagonal lines indicate a diffusion layer and the broken lines indicate a mask pattern for injecting impurity ions for forming the diffusion layer. A portion of the mask pattern for injecting impurity ions overlaps an element separation region. The impurity ions are injected into a substrate region outside the element separation region. The floating gate 6 formed of polysilicon (first conductive material) is provided to cover the substrate 1 via the tunnel oxidized film 3 (first insulating film) so as to be located between a pair comprising the memory diffusion layers 2 and 4. More specifically, the floating gate 6 is adjacent to the drain diffusion layer 2 and is offset by a certain distance from the source diffusion layer 4a. The floating gates 6 for respective blocks are separated from each other.

The control gate 8 formed of polysilicon (second conductive material) covers the floating gate 6 via an insulating film 5 so as to extend in parallel with the memory diffusion layers 2 and 4a and to be common to a plurality of memory cells.

The selection gate 10 common to a plurality of memory cells and formed of polysilicon (third conductive material) is provided to cover the control gate 8 via an insulating film 9 so as to extend to cover, via a gate oxidized film 7, the substrate 1 between the floating gate 6 and the source diffusion layer 4a. The selection gate 10 extends in a direction perpendicular to the direction in which the memory diffusion layers 2 and 4a extend so as to constitute each of the word lines WL1–WL1024.

A memory channel for the memory cell thus constructed is located on the surface of the substrate beneath the floating gate 6 and a selection channel thereof is located on the surface of the substrate between the source diffusion layer 4a and the floating gate 6. A plurality of such memory cells are arranged to form a memory matrix.

The drain diffusion layer 2 is the same as that shown in FIGS. 1 and 2. The source diffusion layer 4a differs from the source diffusion layer 4 shown in FIGS. 1 and 2 in that it is divided into blocks 20 indicated by the broken lines in FIG. 3. Each block contains 16 word lines WL. The source diffusion layer 4a in each block is connected to the metal bit line 14 via the block selection MOS transistor 22. The source diffusion layer 4a is common to the memory cells served by the 16 word lines WL. Since the source diffusion layer 4a is common to the memory cells laterally adjacent thereto on respective sides, a total of 32 memory cells are connected to one source diffusion layer 4a.

The block selection MOS transistor 22 is connected to the metal bit line 14 via a contact hole 32. The metal bit line 14 is formed to cover the source diffusion layer 4a via an insulating film so as to extend parallel with the source diffusion layer 4a.

The gate electrodes of all the block selection MOS transistors 22 in a given block are connected to each other. The block selection signals BS1, BS2, . . . BS for controlling the operation of the block selection MOS transistors 22 are supplied to the gates of the block selection MOS transistors 22 of the respective blocks.

By providing the block selection MOS transistors 22 for respective blocks and selectively operating the block selection MOS transistors 22 in a read operation, the diffusion capacitance imposed on the metal bit line 14 is reduced.

A gate electrode 24 of the block selection MOS transistor 22 is implemented by a polysilicon film that forms the selection gate which, as described above, serves as a word line of the memory cell. A source diffusion layer 24 of the block selection MOS transistor 22 is formed of the same material as the memory diffusion layers of the memory cell. A drain diffusion layer 28 of the block selection MOS transistor 22 is also formed of the same material as the diffusion layers of the memory cell. With this construction, the block selection MOS transistor 22 can be produced at the same time as the memory cell.

By ensuring that the source diffusion layer 4a of the memory cell and the source diffusion layer 26 of the block selection MOS transistor 22 are contiguous with each other, these diffusion layers can be directly connected to each other so that the degree of integration is improved.

The block selection MOS transistor 22 is not coupled to the drain diffusion layer 2. It is also to be noted that the drain diffusion layer 2 is not divided into blocks. The drain diffusion layer 2 is connected via a contact hole 30 to the metal virtual ground line 12 which is formed to cover the drain diffusion layer 2 via an insulating film.

The channel width W of the block selection MOS transistor 22 is designed to be greater than the width of the memory diffusion layers 2 and 4a of the memory cell. With this arrangement, the on-current of the block selection MOS transistor 22 is increased so as to facilitate a high-speed read operation.

The gate electrode 24 of the block selection MOS transistor 22 is wider than the gap L between the diffusion layers. The gate electrode 24 also overlaps portions of the diffusion layers 26 and 28 opposite to each other across the gap L. By employing such an arrangement, the block selection MOS transistor 22 can be properly formed even if misalignment occurs during the production of the memory device.

Figure 5A:
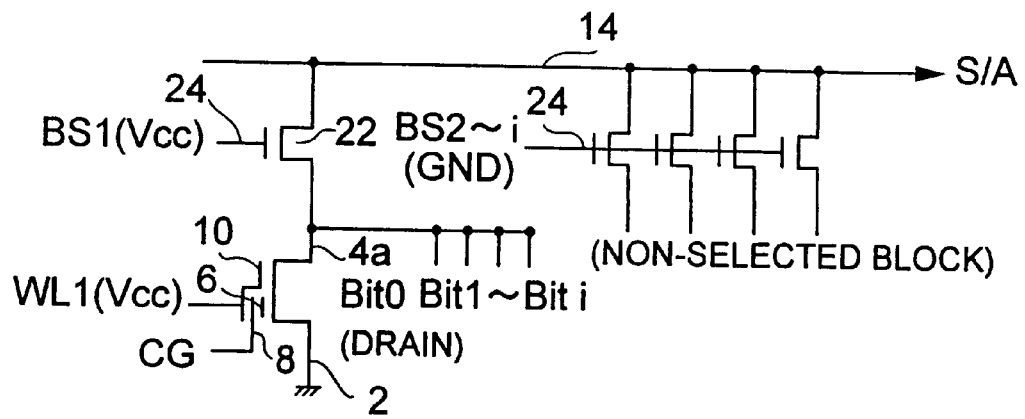
FIGS. 5A, 5B and 5C show an operation of the memory device in a read operation.
Figure 5B:
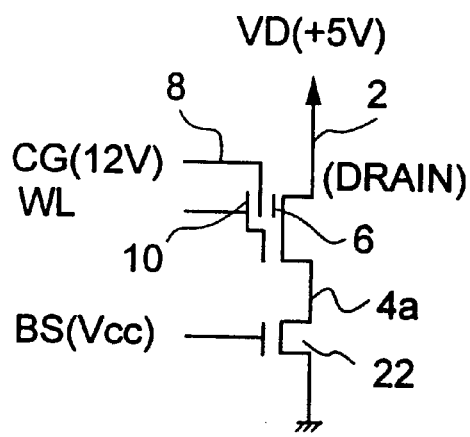
Figure 5C:
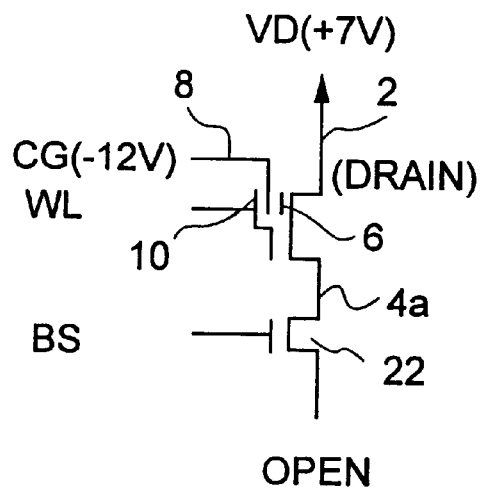

FIGS. 5A, 5B and 5C shows how a voltage is applied to the memory device according to the embodiment of the present invention. FIG. 5A shows a read operation with respect the memory device. A block selection signal BS having a voltage $V_{cc}$ is applied to the gate electrode 24 of the block selection MOS transistor 22 of a block to be selected. The gate electrodes 24 of the block selection MOS transistors 22 of the non-selected blocks are brought to a ground potential. In the selected block, a word line signal having the voltage $V_{cc}$ is applied to the selection gate 10 of the target memory cell for the read operation.

The read operation is performed by detecting a very small current in the memory cell. If the stray capacitance imposed on the metal bit line 14 increases, the read speed is decreased. For this reason, only the source diffusion layer 4a of the block selected by the block selection MOS transistor 22 is connected to the metal bit line. The source diffusion layers 4a of the other blocks are disconnected from the metal bit line 14. Thus, a high-speed read operation is ensured.

FIG. 5B shows how the memory cell of the memory device according to the invention is programmed. The source diffusion layer 4a of the block selected by the block selection MOS transistor 22 is brought to a ground potential. A +5V voltage is applied to the drain diffusion layer 2 of the selected block and a high-voltage of 12V is applied to the control gate 8 of the selected block.

FIG. 5C shows how the memory cell of the memory device is operated in a deletion operation. The source diffusion layer 4a of the block selected by the block selection MOS transistor 22 is brought to a floating state, a voltage of +7V is applied to the drain diffusion layer 2, and a voltage of −12V is applied to the control gate 8.

In a programming operation, a large current is caused to flow in the memory cell. In a deletion operation, a high voltage is applied between the drain diffusion layer 2 and the control gate 8. The drain diffusion layer 2 is not coupled to the block selection MOS transistor 22 and directly connected to the metal line 12 via the contact hole 30. Accordingly, there is no drop in the voltage applied to the drain that may occur due to the threshold voltage of the block selection MOS transistor 22. Therefore, degradation in the quality of the write operation and the read operation is prevented.

A feature of the present invention resides in the construction of the diffusion layer so that, while the embodiment described above concerns a memory device comprising memory cells of a three-layer polysilicon construction, the present invention may also be applied to a memory device provided with memory cells of a two-layer polysilicon construction.

The present invention is not limited to the above described embodiments, and variations and modifications may be made without departing from the scope of the present invention.

This application claims priority of Japanese Application No. 9-062310 filed Feb. 28, 1997 which is incorporated herein by reference.

What is claimed is:

1. A semiconductor memory device including a memory matrix comprising a plurality of memory cells, each of said plurality of memory cells comprising:

a semiconductor substrate;

first memory diffusion layers formed on said semiconductor substrate so as to operate as source regions of the memory cells;

second memory diffusion layers formed on said semiconductor substrate so as to operate as drain regions of the memory cells, each of said second memory diffusion layers being parallel with each of said first memory diffusion layers;

a first insulating film formed on said semiconductor substrate;

floating gates formed of a first conductive material and formed on said first insulating film so as to form respective memory cells, such that each of said floating gates is contiguous with one of said first memory diffusion layer and said second memory diffusion layer, and is laterally offset by a predetermined distance from the another one of said first memory diffusion layer and said second memory diffusion layer, said floating gates for respective memory cells being physically separate from each other;

gate electrode structures each formed on a corresponding one of said floating gates and which are mutually insulated, a semiconductor substrate surface underneath each of said floating gates operating as a memory channel of the memory cell, and a semiconductor substrate surface between the floating gate and said another one of said first memory diffusion layer and said second memory diffusion layer operating as a selection channel of the memory cell, wherein said memory matrix is segmented into a plurality of blocks each including a plurality of memory cells such that one of said first memory diffusion layer and said second memory diffusion layer connected to a sense amplifier in a read operation is divided into independent segments corresponding to said plurality of blocks, and such that said independent segments are connected to a common metal bit line via block selection transistors provided for respective blocks, and each of said block selection transistors is a MOS transistor comprising:
- a source region and a drain region formed of the same material as said first memory diffusion layer and said second memory diffusion layer; and
- a gate electrode for receiving a block selection signal for controlling operation of the MOS transistor.

2. A semiconductor memory device including a memory matrix comprising a plurality of memory cells, each of said plurality of memory cells comprising:

a semiconductor substrate;

first memory diffusion layers formed on said semiconductor substrate so as to operate as source regions of memory cells;

second memory diffusion layers formed on said semiconductor substrate so as to operate as drain regions of the memory cells, each of said second memory diffusion layers being parallel with each of said first memory diffusion layers;

a first insulating film formed on said semiconductor substrate;

floating gates formed of a first conductive material and formed on said first insulating film so as to form respective memory cells, such that each of said floating gates is contiguous with one of said first memory diffusion layer and said second memory diffusion layer, and is laterally offset by a predetermined distance from another one of said first memory diffusion layer and said second memory diffusion layer, said floating gates for respective memory cells being physically separate from each other;

a second insulating film formed on said semiconductor substrate; and gate electrode structures each formed on a corresponding one of said floating gates, each of said gate electrode structures including a selection gate of the memory cell, said selection gate being formed of a second conductive material and formed on said second insulating film so as to cover the floating gate and to extend in a direction perpendicular to a direction in which said first memory diffusion layer and said second memory diffusion layer extend, the semiconductor substrate surface underneath each of said floating gates operating as a memory channel of the memory cell, and the semiconductor substrate between the floating gate and said another one of said first memory diffusion layer and said second memory diffusion layer operating as a selection channel of the memory cell, wherein said memory matrix is segmented into a plurality of blocks each including a plurality of memory cells such that one of said first memory diffusion layer and said second memory diffusion layer connected to a sense amplifier in a read operation is divided into independent segments corresponding to said plurality of blocks, and such that said independent segments are connected to a common metal bit line via block selection transistors provided for respective blocks, and each of said block selection transistors is a MOS transistor comprising:
- a source region and a drain region formed of the same material as said first memory diffusion layer and said second memory diffusion layer; and
- a gate electrode formed of the second conductive material.

3. The semiconductor memory device as claimed in claim 1, wherein each of said gate electrode structures formed on the floating gates comprises:

a second insulating film formed on said semiconductor substrate;

a third insulating film formed on the floating gate;

a control gate formed of a second conductive material and formed on said third insulating film, so as to extend parallel with said first memory diffusion layer and said second memory diffusion layer and to serve a plurality of memory cells;

a fourth insulating film formed on the control gate;

a selection gate formed of a third conductive material and including a first portion and a second portion, said first portion being formed on said fourth insulating film so as to be located above said control gate, and said second portion being formed on said second insulating film between the floating gate and said another one of said first memory diffusion layer and said second memory diffusion layer, so as to extend in a direction perpendicular to a direction in which said first memory diffusion layer and said second memory diffusion layer extend and to serve a plurality of memory cells.

4. The semiconductor memory device as claimed in claim 3, wherein said gate electrode of each of said block selection transistors is formed of the third conductive material.

5. The semiconductor memory device as claimed in claim 1, wherein each of said gate electrode structures formed on the floating gate comprises:

a second insulating film formed on said semiconductor substrate;

a third insulating film formed on the floating gate;

a control gate including a first portion and a second portion, said first portion being formed on said third insulating film so as to be located above said floating gate, and said second portion being formed on said second insulating film between the floating gate and said another one of said first memory diffusion layer and said second memory diffusion layer, so as to extend in a direction perpendicular to a direction in which said first memory diffusion layer and said second memory diffusion layer extend and to serve a plurality of memory cells both as a control gate of the memory cell and as a selection gate of the memory cell.

6. The semiconductor memory device as claimed in claim 5, wherein said gate electrode of each of said block selection transistors is formed of the same conductive material as said control gate.

7. The semiconductor memory device as claimed in claim 1, wherein the memory diffusion layer not connected to the sense amplifier in the read operation is provided so as to be common to a plurality of blocks.

8. The semiconductor memory device as claimed in claim 2, wherein said source region of each of said block selection transistors and said drain region of each of said block selection transistors are formed as discontiguous diffusion layers extending in a direction in which said first memory diffusion layer and said second memory diffusion layer extend, producing an gap between said source region and said drain region, a width of said gap being equal to a channel length of the block selection transistor, and said gate electrode of each of said block selection transistors is formed of the second conductive material and formed to cover said gap.

9. The semiconductor memory device as claimed in claim 8, wherein a channel width of each of said block selection transistors is greater than a width of said first memory diffusion layer and said second memory diffusion layer.

10. The semiconductor memory device as claimed in claim 8, wherein a width of said gate electrode of the block selection transistor is greater than said gap such that said gate electrode overlaps portions of said source region and said drain region opposite to each other across said gap.

11. The semiconductor memory device as claimed in claim 1, wherein one of said source region and said drain region of each of said block selection transistors is connected to the metal bit line via a contact hole and another one of said source region and said drain region of each of said block selection transistor is formed as a diffusion layer contiguous with the memory diffusion layer divided into independent segments.

* * * * *